(12) United States Patent
Fukuda

(10) Patent No.: US 7,033,933 B2
(45) Date of Patent: Apr. 25, 2006

(54) MANUFACTURING METHOD OF SEMICONDUCTOR DEVICE

(75) Inventor: Mikio Fukuda, Gunma (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 10/875,604

(22) Filed: Jun. 25, 2004

(65) Prior Publication Data

US 2005/0026362 A1    Feb. 3, 2005

(30) Foreign Application Priority Data

Jun. 27, 2003    (JP) .............................. 2003-184371

(51) Int. Cl.
*H01L 21/44* (2006.01)
*H01L 21/20* (2006.01)

(52) U.S. Cl. ........................ 438/663; 438/664; 438/683

(58) Field of Classification Search ................ 438/393, 438/394, 655, 656, 657, 663, 664, 683
See application file for complete search history.

(56) References Cited

U.S. PATENT DOCUMENTS 5,656,529 A * 8/1997 Fukase ........................ 438/398
6,087,240 A * 7/2000 Gilchrist ...................... 438/398
6,281,118 B1 * 8/2001 Park ............................ 438/655
6,440,848 B1 * 8/2002 Hong .......................... 438/649
2004/0259369 A1 * 12/2004 Dong et al. ................. 438/705

FOREIGN PATENT DOCUMENTS

| JP | 6-061423 | 3/1994 |
|---|---|---|
| JP | 2705476 | 1/1998 |

* cited by examiner

*Primary Examiner*—Trung Dang
(74) *Attorney, Agent, or Firm*—Morrison & Foerster LLP

(57) ABSTRACT

A breakdown voltage of a capacitive element is improved by re-crystallizing a tungsten silicide film under a dielectric film. In forming the capacitive element which uses a polycrystalline silicon film and the tungsten silicide film as a lower electrode, the tungsten silicide film is re-crystallized by heating using an RTA (Rapid Thermal Annealing) system before forming a silicon oxide film used as the dielectric film. By doing so, an interface between the silicon oxide film and the tungsten silicide film is prevented from becoming uneven and a breakdown voltage of the dielectric film is improved drastically. Thus an amount of electric charge stored in the capacitive element is increased as well as it is made possible that the capacitive element is applied to a semiconductor device operating at higher voltage.

3 Claims, 4 Drawing Sheets

MANUFACTURING METHOD OF SEMICONDUCTOR DEVICE

CROSS-REFERENCE OF THE INVENTION

This invention is based on Japanese Patent Application No. 2003-184371, the content of which is incorporated herein by reference in its entirety.

BACKGROUND OF THE INVENTION

1. Field of the Invention

This invention relates to a manufacturing method of a semiconductor device having a capacitive element, specifically to a technology to improve characteristics of a dielectric film of the capacitive element.

2. Description of the Related Art

In a method to form a capacitive element in a semiconductor device, a dielectric film and an upper electrode are formed on a lower electrode having the same structure as a gate electrode. The lower electrode in this manufacturing method often takes a polycide structure, i.e., stacked layers of a polycrystalline silicon film and a tungsten silicide film.

The dielectric film made of an insulating material is formed on the lower electrode and the upper electrode made of a polycrystalline silicon film is formed on the dielectric film. The method has a merit that the lower electrode can be formed simultaneously with the gate electrode, since the lower electrode has the same structure as the gate electrode. The manufacturing method is hereinafter described in detail with respect to FIGS. 6–9.

A polycrystalline silicon film 12 is formed on a silicon oxide film 11 which is formed on a semiconductor substrate (not shown) by LOCOS (Local Oxidation of Silicon), as shown in FIG. 6. Explanations on a method to form the silicon oxide film by LOCOS is omitted since it is well known to those skilled in the art.

The resistivity of the polycrystalline silicon film 12 needs to be reduced in order to use it as an electrode. The resistivity of the polycrystalline silicon film may be reduced by any of available methods, including doping it with impurities during formation of the polycrystalline silicon film and doping it with impurities by thermal diffusion or ion implantation after forming the polycrystalline silicon film.

After that, a tungsten silicide film 13 and a silicon oxide film 14 which will be used as a hard mask in patterning the lower electrode are formed on the polycrystalline silicon film 12.

The silicon oxide film 14 to be used as the hard mask is etched using a patterned photoresist film (not shown) as a mask, and then the photoresist film is removed. The tungsten silicide film 13 and the polycrystalline silicon film 12 are etched using the patterned silicon oxide film 14 as the hard mask. The lower electrode is hereby formed.

After that, source and drain regions are formed by implanting impurity ions into regions adjacent the gate electrode formed simultaneously with the lower electrode, followed by thermal diffusion of the impurity ions. A silicon oxide film 15 which makes a sidewall is formed on each side surface of the lower electrode to make the source drain regions LDD (Lightly Doped Drain) structure, as shown in FIG. 7. The tungsten silicide film 13 is crystallized due to a heat treatment to form the source drain regions, as depicted as 13A in FIG. 7.

Next, an opening is formed by plasma etching in the silicon oxide film 14 used as the hard mask to provide a region for contact between the tungsten silicide film 13 and the dielectric film to be formed, as shown in FIG. 8. Part of the tungsten silicide film 13A in the opening undergoes a phase transformation from crystalline to amorphous in this process due to damage done by the plasma etching, as depicted as 13B in FIG. 8.

After forming the dielectric film, the polycrystalline silicon film 19 to make the upper electrode of the capacitive element is formed on the dielectric film, as shown in FIG. 9. The resistivity of the polycrystalline silicon film 19 is also reduced by the method described above.

The most common material for the dielectric film is a silicon nitride film. The dielectric film may be made of a silicon nitride film and a silicon oxide film formed under the silicon nitride film. Or, it may be made of a silicon nitride film and a silicon oxide film formed on the silicon nitride film by oxidizing a top portion of the silicon nitride film. The dielectric film is made of stacked layers of a silicon oxide film 16, a silicon nitride film 17 and a silicon oxide film 18 in this embodiment.

Patterning a photoresist film (not shown) and etching the polycrystalline silicon film 19 and the dielectric film complete the formation of the capacitive element. Further details may be found in Japanese Patent No. 2705476

There is a problem in the manufacturing method described above. The breakdown voltage of the dielectric film is not high enough. Consequently the capacitive element can not be used in a semiconductor device operating at high voltage and the capacitive element can not store a large quantity of electric charge.

SUMMARY OF THE INVENTION

This invention includes a heat treatment to re-crystallize a tungsten silicide film before forming a dielectric film so that the tungsten silicide film is prevented from re-crystallizing in a process after forming a capacitive element of a semiconductor device, so that an even interface between the dielectric film and a lower electrode is formed. Probably because of this formation of the even interface, or possibly because of an effect of the heat treatment that is not positively recognized, a breakdown voltage of the dielectric film is improved drastically, increasing a quantity of stored electric charge and enabling using the capacitive element in a semiconductor device of higher operating voltage.

DETAILED DESCRIPTION OF THE INVENTION

The quantity of electric charge stored in the capacitive element is represented by a product of capacitance of the capacitive element and a voltage applied to the capacitive element. The capacitance is represented by a dielectric constant of the dielectric film multiplied by an area of the electrode of the capacitive element divided by a distance between the electrodes.

In order to increase the quantity of stored electric charge while keeping small dimensions, it is conceivable that a material having a higher dielectric constant is chosen and used as the dielectric film. However, changing the dielectric film material is not regarded as the best solution when the cost of alternative materials and the equipment suitable for those materials are taken into consideration.

With this being the situation, the inventor has tried to work out a method to improve the breakdown voltage of the dielectric film. If the breakdown voltage of the dielectric film is successfully increased, a thickness of the dielectric film can be reduced without sacrificing the breakdown voltage. Or, the voltage applied to the capacitive element can be increased while maintaining the thickness of the dielectric film. Furthermore, if the breakdown voltage is improved drastically, a capacitive element having higher breakdown voltage can be realized with thinner dielectric film.

Figure 8:
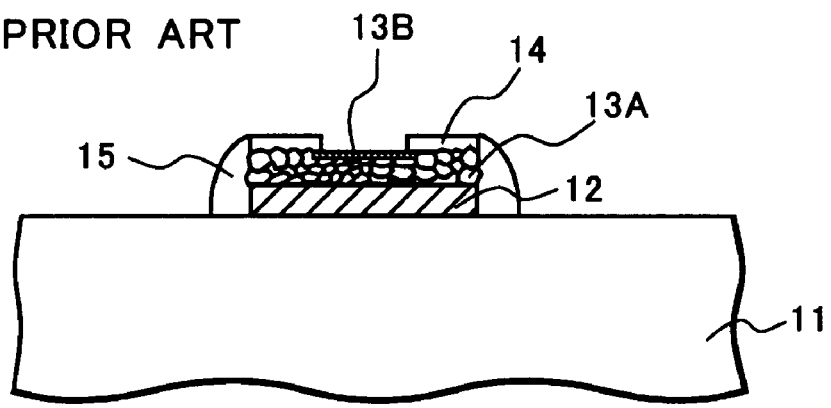

The inventor has found that the breakdown voltage of the dielectric film is reduced because the amorphous tungsten silicide film 13B shown in FIG. 8 is re-crystallized by the heat treatment after forming the capacitive element. A mechanism of the re-crystallization of the tungsten silicide film is as follows.

Figure 9:
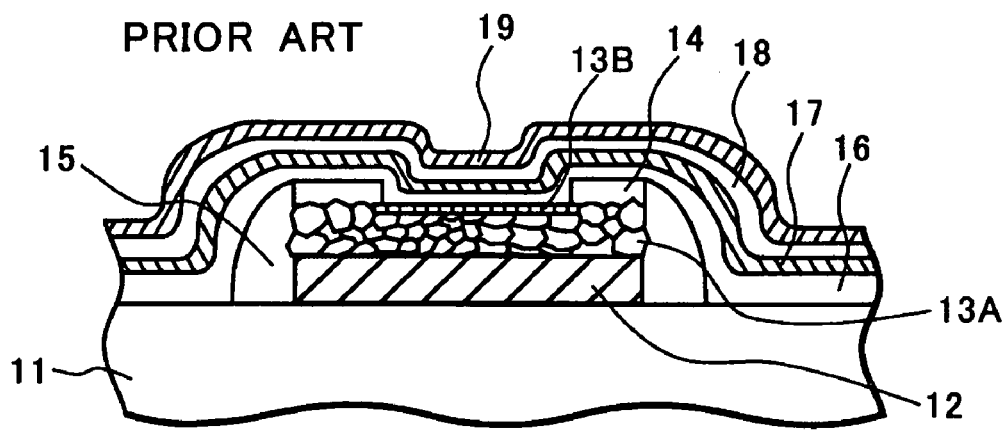

The amorphous tungsten silicide film 13B does not re-crystallize at temperature to form the dielectric film, as shown in FIGS. 8 and 9. However, there is a heat treatment which takes place after the formation of the capacitive element at higher temperature than the temperature to form the dielectric film. Such a heat treatment causes the re-crystallization of the tungsten silicide film. As a result, an interface between the dielectric film and the tungsten silicide film becomes uneven, leading to deterioration in the breakdown voltage of the dielectric film.

A method of manufacturing a semiconductor device according to an embodiment of this invention will be described hereafter.

Figure 1:
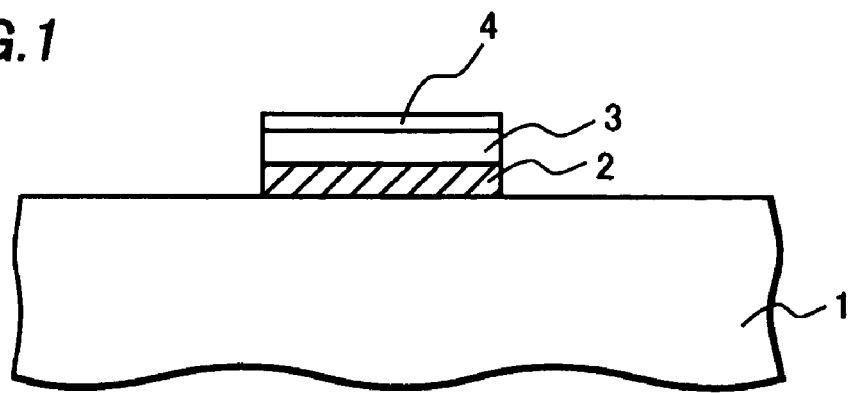
FIGS. 1–5 are cross-sectional views showing process steps of a method of manufacturing a semiconductor device according to an embodiment of this invention.

A polycrystalline silicon film 2 of 80–120 nm in thickness, a tungsten silicide film 3 of 80–120 nm in thickness and a silicon oxide film 4 of 120–180 nm in thickness to be used as a hard mask in etching are formed on a silicon oxide film 1 formed on a semiconductor substrate (not shown) by LOCOS, as shown in FIG. 1. A photoresist film (not shown) is applied for patterning the polycrystalline silicon film 2 and the tungsten silicide film 3 to form a lower electrode.

The polycrystalline silicon film 2 is reduced in resistivity by the same method as described in the Related Art section.

Figure 2:
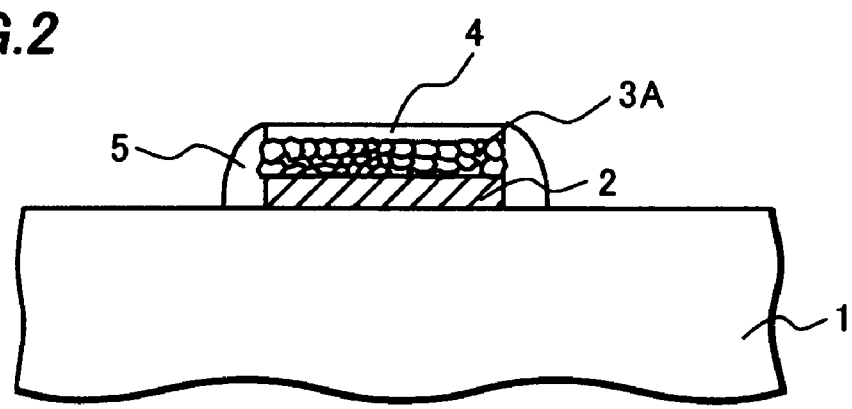
Figure 3:
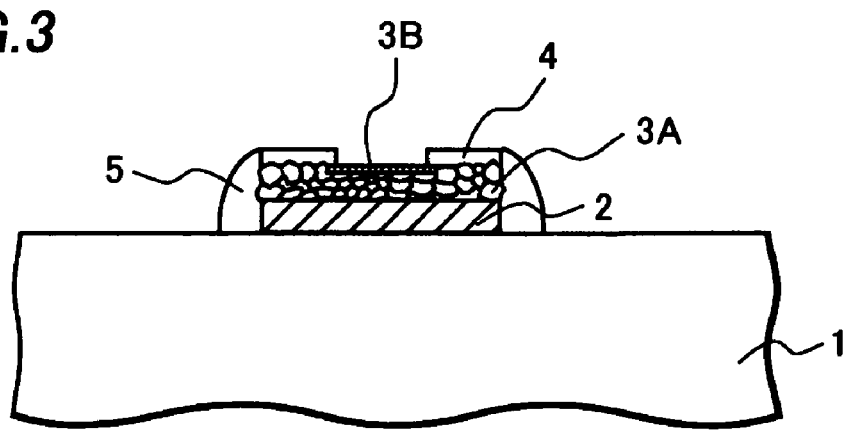

A silicon oxide film 5 which makes a sidewall is formed on each side surface of the lower electrode as shown in FIG. 2, when source and drain regions are formed in the LDD structure in regions adjacent a gate electrode formed simultaneously with the lower electrode as described above.

However, this embodiment does not necessarily include the lower electrode having the sidewall. The lower electrode may be without the sidewall.

The tungsten silicide of the lower electrode is crystallized by a heat treatment to form the source and drain regions, as depicted as 3A in FIG. 2.

After applying and patterning a photoresist film (not shown), an opening is formed by plasma etching in the silicon oxide film 4 used as the hard mask. A surface portion of the crystalline tungsten silicide film in the opening undergoes a phase transformation from crystalline to amorphous due to damage caused during the plasma etching.

Figure 4:
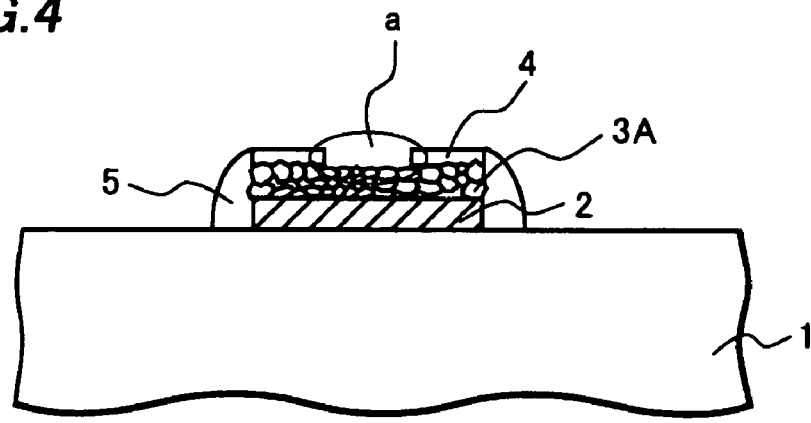
Figure 5:
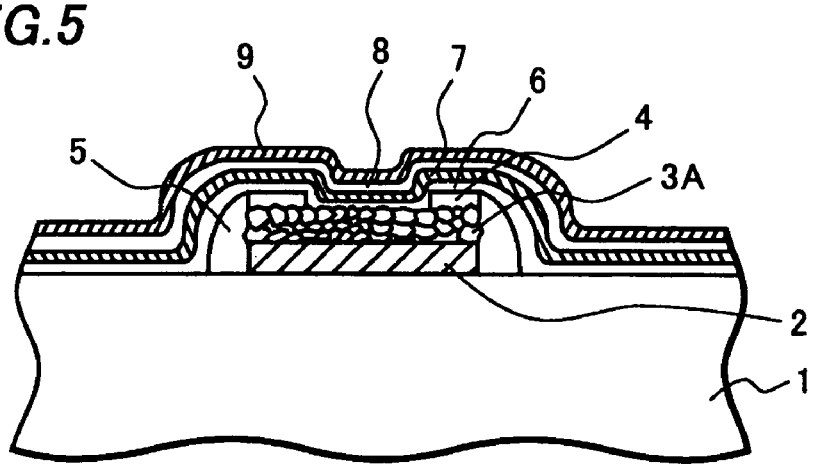
Figure 6:
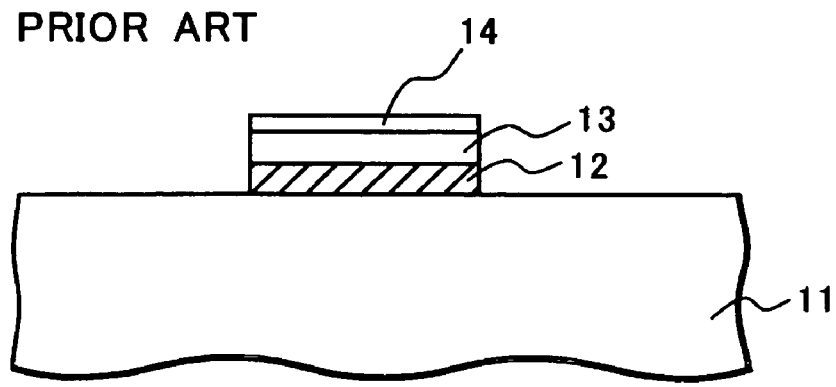
FIGS. 6–9 are cross-sectional views showing process steps of a method of manufacturing a semiconductor device according to a conventional art.
Figure 7:
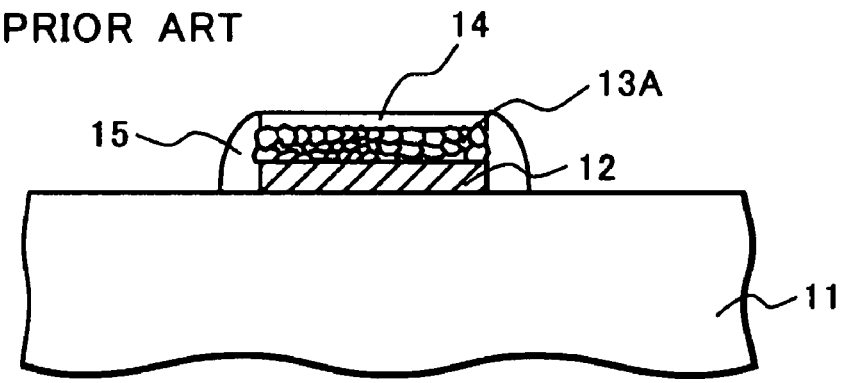

A heat treatment is applied with an RTA (Rapid Thermal Annealing) system in nitrogen or oxygen atmosphere so that the amorphous tungsten silicide film 3B is re-crystallized before forming a dielectric film. The amorphous portion of the tungsten silicide film is re-crystallized by the heat treatment as depicted as a in FIG. 4. As a result, an interface between the dielectric film and the tungsten silicide film is not made uneven and breakdown voltage is not reduced, even when a heat treatment is given after forming a capacitive element.

The atmosphere during the heat treatment is preferably nitrogen, although oxygen is applicable too. Heating to 750° C. or above is preferable for the re-crystallization of the tungsten silicide film. Using a diffusion furnace as the heating equipment is also possible. However, since air is drawn in when a wafer is carried into the diffusion furnace, the re-crystallization is not stable enough in peripheral portions of the wafer. Thus the surface of the wafer is rougher and the breakdown voltage is not high enough compared with the case using the RTA system.

A silicon oxide film 6 of 15–25 nm in thickness, a silicon nitride film 7 of 10–20 nm in thickness and a silicon oxide film 8 of 30–40 nm in thickness are formed as the dielectric film. The dielectric film is not limited to the stacked films of the oxide film, the nitride film and the oxide film as described above. It may be made of a nitride film only, an oxide film plus a nitride film or a nitride film plus an oxide film. Furthermore, the thickness of the dielectric film varies depending on required capacitance, and may be different from the thicknesses described in the embodiment.

After that, a polycrystalline silicon film 9 of 120–180 nm in thickness is formed to be used as an upper electrode. Etching the polycrystalline silicon film 9 and the dielectric film using a mask of a photoresist film (not shown) complete the formation of the capacitive element.

Figure 10:
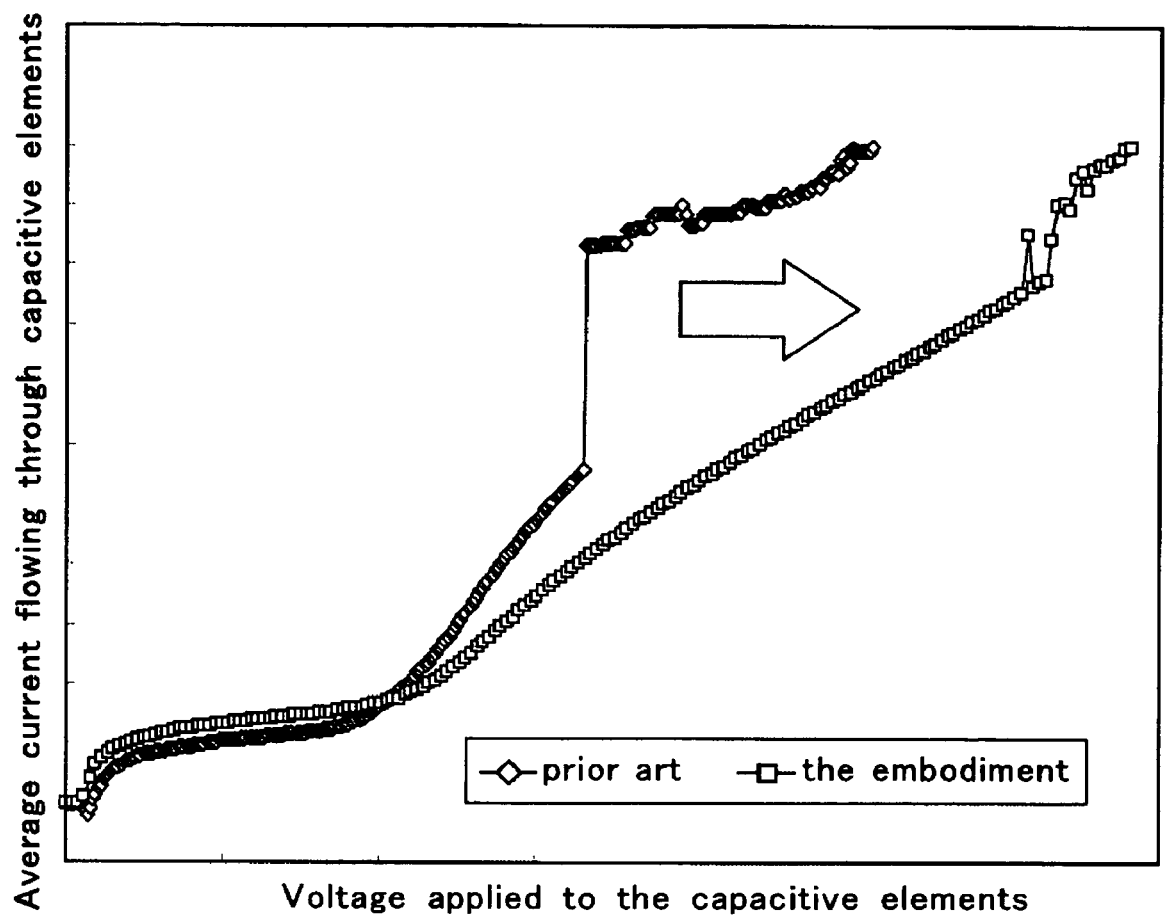
FIG. 10 shows I–V characteristics of the semiconductor device of the embodiment in comparison to the semiconductor device of the conventional art.

FIG. 10 is a graph showing correlation between an average current flowing through capacitive elements and voltage applied to the capacitive elements. The average current is an average of current values measured with 35 capacitive elements formed on a wafer. When the applied voltage is increased, the average current increases drastically at a certain voltage due to a dielectric breakdown of the dielectric film. The higher this voltage is, the higher the breakdown voltage of the dielectric film is. The graph shows that the breakdown voltage is doubled by this embodiment.

The breakdown voltage of the dielectric film is improved drastically according to the manufacturing method of the semiconductor device of this invention. Consequently, the amount of electric charge stored in the capacitive element is increased. In addition, it is made possible that the capacitive element is applied to a semiconductor device operating at higher voltage.

This invention uses equipment already used in an existing process step and requires no additional equipment. Since this invention requires an additional heating process only, it drastically improves characteristics of the dielectric film with minimum increase in manufacturing cost and process steps.

What is claimed is:

1. A method of manufacturing a semiconductor device, comprising:
    forming a stacked layer of a first polycrystalline silicon film, a tungsten silicide film and a silicon oxide film;
    patterning the silicon oxide film;
    patterning the first polycrystalline silicon film and the tungsten silicide film using the patterned silicon oxide film as a hard mask to form a lower electrode;

forming an opening in the patterned silicon oxide film;
forming a dielectric film on the lower electrode;
forming a second polycrystalline silicon film on the dielectric film;
patterning the second polycrystalline silicon film to form an upper electrode; and
heating the lower electrode at 750° C. or above in nitrogen or oxygen atmosphere using a rapid thermal annealing system prior to the forming of the dielectric film to re-crystallize part of the tungsten silicide film.

2. The method of claim 1, wherein the forming of the dielectric film comprises forming a silicon nitride film.

3. The method of claim 1, wherein the forming of the dielectric film comprises forming a silicon nitride film and another silicon oxide film.

* * * * *